United States Patent [19]

Bobbio

[11] Patent Number: 5,064,748
[45] Date of Patent: * Nov. 12, 1991

[54] METHOD FOR ANISOTROPICALLY HARDENING A PROTECTIVE COATING FOR INTEGRATED CIRCUIT MANUFACTURE

[75] Inventor: Stephen M. Bobbio, Wake Forest, N.C.

[73] Assignee: MCNC, Research Triangle Park, N.C.

[*] Notice: The portion of the term of this patent subsequent to May 2, 2006 has been disclaimed.

[21] Appl. No.: 454,759

[22] Filed: Dec. 21, 1989

Related U.S. Application Data

[63] Continuation-in-part of Ser. No. 294,735, Jan. 6, 1989, abandoned, which is a continuation of Ser. No. 42,932, Apr. 27, 1987, Pat. No. 4,826,754.

[51] Int. Cl.⁵ .................................................. G03C 5/00
[52] U.S. Cl. .................................... 430/311; 437/227; 156/628
[58] Field of Search ...................... 430/311; 437/227; 156/628

[56] References Cited

U.S. PATENT DOCUMENTS

| | | | |
|---|---|---|---|
| 3,997,342 | 12/1976 | Sakurai et al. | 430/158 |
| 4,068,018 | 1/1978 | Hashimoto et al. | 427/38 |
| 4,115,120 | 9/1978 | Dyer et al. | 437/187 |
| 4,231,811 | 11/1980 | Somekh et al. | 148/1.5 |
| 4,268,615 | 5/1981 | Yonezawa | 430/320 |
| 4,499,177 | 2/1985 | Vollenbroek et al. | 430/311 |
| 4,529,860 | 7/1985 | Robb | 219/121 PE |
| 4,543,320 | 9/1985 | Vijan | 430/314 |
| 4,826,754 | 2/1989 | Bobbio | 430/311 |

OTHER PUBLICATIONS

"VLSI Technology"—by S. M. Sze—Copyrighted 1983, McGraw Hill Book Co., N.Y., pp. 267-273.
Chapter 12 of "Silicon Processing for the VLSI Era'-'—By Wolf & Tauber.

Primary Examiner—Charles L. Bowers, Jr.
Assistant Examiner—Thomas R. Neville
Attorney, Agent, or Firm—Bell, Seltzer, Park & Gibson

[57] ABSTRACT

A method for anisotropically hardening a protective coating to provides a well defined edge thereon for forming features which may be smaller than the resolution limit of the exposure equipment, for the purpose of integrated circuit manufacture. The method includes the steps of forming a non-planar coating on a substrate with a photoresist material having a sensitivity ot incident flux that varies as a function of the angle of the incidence of the flux upon the coating. The coating is anisotropically hardened by exposing it to flux to which it has a relatively high sensitivity so that portions for which the flux is incident at one angle are more hardened than those portions where the flux is incident at a different angle. Narrow trenches or studs may thereby be formed.

12 Claims, 2 Drawing Sheets

5,064,748

METHOD FOR ANISOTROPICALLY HARDENING A PROTECTIVE COATING FOR INTEGRATED CIRCUIT MANUFACTURE

CROSS REFERENCE TO RELATED APPLICATION

This application is a continuation-in-part of copending application Ser. No. 294,735, filed Jan. 6, 1989 abandoned, which in turn is a continuation of then co-pending application Ser. No. 42,932 filed Apr. 27, 1987, now U.S. Pat. No. 4,826,754.

FIELD OF THE INVENTION

This invention relates to a method for anisotropically (or directionally) hardening a protective film for integrated circuit manufacture in order to produce very small features in a masking layer.

BACKGROUND OF THE INVENTION

Present techniques for forming small features in the thin films in integrated circuit manufacture make use of etching in the presence of etch resistant layers or sections of photoresist that have been irradiated to provide a selected pattern. This involves traditional photo engraving or photolithographic processes. However, with the continued miniaturization of semiconductor integrated circuits it has become increasingly difficult to maintain the necessary resolution between lines and features which comprise the components of the integrated circuit.

Alternative methods, which are well known in the art, have been designated expandable mask methods, liftoff methods or stencil methods. However, because of the methods used for hardening the photoresist and then etching non-hardened areas, some of the deposited films have an undesirable negative slope or overhang which poses problems to subsequent processing steps. Similarly, some current wet chemical and high pressure plasma etch processes often produce unwanted lateral etching which undercuts the deposited film. As the size and geometries of the devices have continued to shrink, as well as the openings and lines therein, the necessity for closely spaced features and openings, and the necessity to accurately maintain a high degree of resolution, has made more acute the need for a thin film with an anisotropically hardened edge that is very well defined to produce small features in the masking layer.

The problem is highlighted with a photoresist film that is coated onto a non-planar substrate having small isolated features or a group of features that are bunched close together. The non-planar surface scatters the incident radiation used to harden the photoresist and may result in excessive film loss. Whether the undesired result is over-development, over-exposure, or any other baseline shifting, the features may be enlarged, resulting in a profile which is dramatically different from that desired. While the features may be widely spaced to obtain the proper resolution, the spacing is excessive and packing density suffers. Reactive ion etching and ion milling have been used to minimize standing wave patterns caused by interference from reflected light and to provide a well defined or step edge on the protective film, but this requires three level processing, namely, a thick organic film, an inorganic intermediate masking layer, and a thin top layer of X-ray or E-beam photoresist.

In view of the need for a method for providing very small features in a protective film used in integrated circuit manufacture, the need existed for a method for anisotropically hardening the film to define the desired edge.

SUMMARY OF THE INVENTION

Accordingly, it is an object of the present invention to create integrated circuit features by anisotropically hardening a protective film for integrated circuit manufacture to provide a well defined edge. It is a further object of the present invention to provide methods by which such hardening may be accomplished.

It is another object of the present invention to provide an improved method for avoiding the unnecessary feature enlargement often associated with conventional photolithographic processing.

These and other objects and advantages are achieved in accordance with the invention through a method for anisotropically hardening a protective coating to provide a well defined edge. A non-planar coating is formed on a substrate with a photoresist material that is resistant to subsequent processing steps after exposure to an incident flux. The sensitivity of the coating to the incident flux is a function of the angle of incidence of the flux upon the coating. The coating is anisotropically hardened by exposing it to a dosage of directional flux so that first portions of the coating irradiated at a first angle are hardened and second portions of the coating irradiated at a second angle are less hardened. A well defined feature for integrated circuit manufacture is then formed in one of the first and second portions of the coating.

In a first embodiment, those portions of the coating irradiated at an angle corresponding to a higher sensitivity are hardened to subsequent processing steps, and those portions irradiated at an angle corresponding to a lower sensitivity are less hardened. The less hardened portions are removed to thereby form narrow channels in the coating. In a second embodiment, those portions of the coating irradiated at an angle corresponding to a higher sensitivity are less hardened to subsequent processing steps, and those portions irradiated at an angle corresponding to a lower sensitivity are more hardened. The less hardened portions are retained, for example by silylating the less hardened portions, to thereby form narrow studs. Accordingly, very small features are created by anisotropically hardening a protective film for integrated circuit manufacture to provide a well defined edge.

DESCRIPTION OF THE PREFERRED EMBODIMENT

Figure 1:
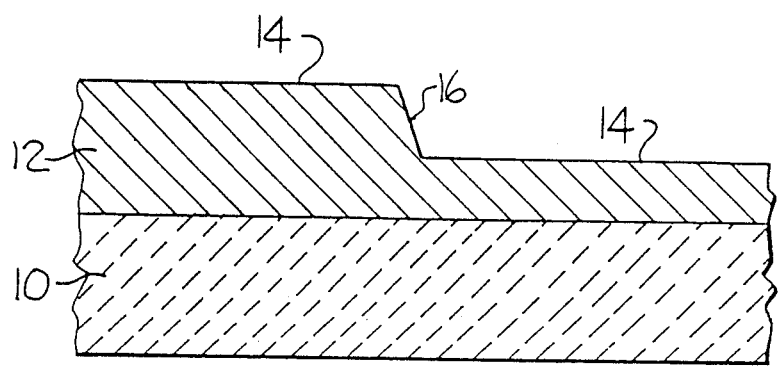
FIG. 1 illustrates a semiconductor substrate having a non-planar coating of resist material deposited thereon, according to a first embodiment of the present invention.

FIG. 1 illustrates a typical structure encountered in semiconductor manufacture. A substrate 10, silicon or the like, has deposited thereon a material 12 that will either comprise a part of the semiconductor device or be used as an aid in manufacturing the device. The deposited material has a non-planar surface, with some surface portions, such as 14, generally parallel to the substrate surface, and other surface portions, such as 16, oblique to the substrate surface. Although the substrate 10 is illustrated with a planar surface, this is not necessary.

Figure 2:
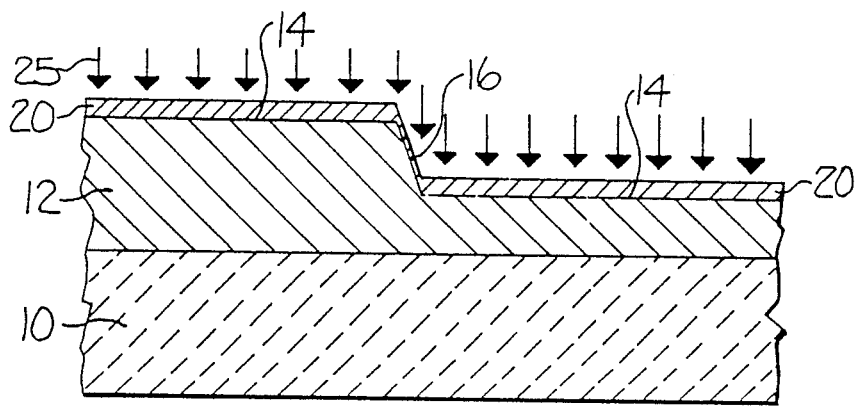
FIG. 2 illustrates the exposure of the coating of FIG. 1 to realize an anisotropically hardened top layer, according to a first embodiment of the present invention.

Referring to FIG. 2, the deposited material 12 and substrate 10 are exposed to a directional flux 25 which either directly deposits material or chemically changes the underlying material 12. The results is the formation of a top layer 20 which is shown in FIG. 2. The thickness of the top layer 20 is a function of the angle of incidence of the flux 25 upon the deposited material. For the situation shown in FIG. 2 top layer 20 is much thinner in the region of the edge or sidewall 16.

Two specific examples will be given. In a first example the layer 12 is a Conventional organic polymer such as Shipley positive resist material and the directional flux is comprised of silicon atoms, as from a conventional evaporator. The layer 20 is then amorphous silicon. In a second example the layer 12 is a dyed positive resist which is very susceptible to silylation, i.e. the addition of silicon. An example of such material is a UCB product called Desire. The flux 25 is then a flux of radiation between 2000 and 5000 Ångstroms which is suitable for exposure of the underlying material 12. The material, so exposed, is very susceptible to the incorporation of silicon from a suitable vapor phase source, such as HMDS or hexamethaldisilazane vapors. The silicon is selectively absorbed into the exposed areas and thus the region 20 is made silicon rich.

Figure 3:
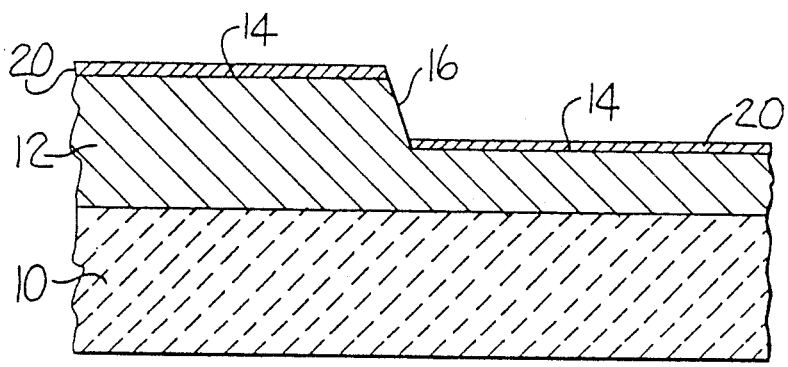
FIG. 3 illustrates the structure of FIG. 2 after exposure and after an isotropic etch, according to a first embodiment of the present invention.

The composite shown in FIG. 2 is then subjected to an isotropic removal step which removes some of the hardened layer 20. The result is shown in FIG. 3, where the sidewall 16 of the deposited material is exposed, but the parallel surface 14 remains coated by the formed top layer 20. For either example the structure is exposed to a moderately high pressure plasma, such as a pressure in excess of 100 mtorr, made from a fluorinated gas, such as $C_2F_6$ or $SF_6$. The action of the etch plasma is to uniformly remove a portion of the layer 20. The process is terminated when all of layer 20 has been removed from the sidewall 16.

Figure 4:
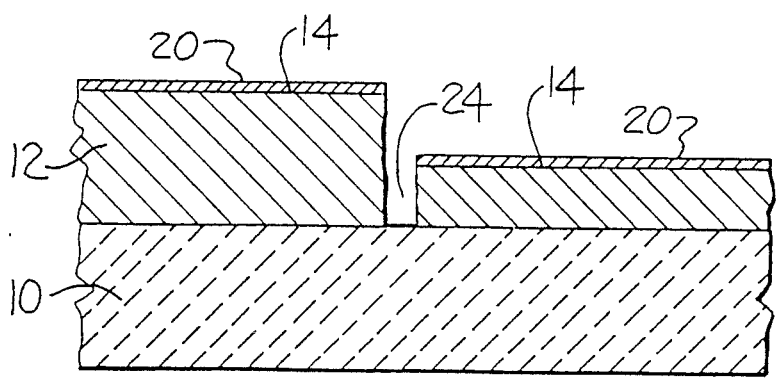
FIG. 4 illustrates the structure of FIG. 3 following an anisotropic etch of the deposited resist material, according to a first embodiment of the present invention.

The composite in FIG. 3, i.e. the exposed sidewall 16 and remaining top layer 20, is now exposed to a process which anisotropically etches the underlayer of deposited material 12 at the exposed sidewall, but to which the hardened top layer 20 is relatively impervious. The result is shown in FIG. 4. A suitable anisotropic etchant for either example is a low pressure oxygen plasma discharge, such as a pressure less than 100 mtorr, with substantial bias voltage on the substrate, in a reactive ion etch mode. This generates a very narrow channel feature 24 through the deposited material 12 via the exposed sidewall portion 16.

This feature may be useful in itself or used for subsequent processing of the substrate 10, which is now exposed at the bottom of the channel 24. The top layer 20 may be removed by the application of a fluorinated plasma, and the deposited material 12 can be removed as necessary or desirable by an oxygen plasma. The size of the feature channel 24 when formed in the manner just described may be much smaller than that obtainable with conventional lithography which is currently limited to about 0.7 μm.

As another example, a material 12 is deposited onto a substrate, and an edge 16 is defined, as in FIG. 1. The source of the flux 25 in FIG. 2 may be either a low pressure plasma or an instrument designed specifically for this purpose. A suitable arrangement would consist of a reactive ion etch apparatus to which has been added a thermal source of methacrylic acid. The plasma is established in argon and the vapor pressure of the acid is adjusted so that the mean free path at this particular pressure is large compared to the internal dimensions of the vacuum chamber. Acid monomers absorb on all exposed surfaces but only cross link where positive argon ions or electron activation has been supplied. The non-cross linked material is dissolved in a subsequent step leaving a hardened protective photoresist film layer only on the generally planar surfaces which had been irradiated.

A second embodiment of the invention forms a very narrow stud feature, as opposed to the very narrow channel feature described above in connection with FIGS. 1-4. In one example of this embodiment, a non-planar surface of photoresist is less exposed to incident radiation than the planar surfaces of the photoresist. A silylation process incorporates silicon into the less exposed, non-planar surface. The planar surfaces are etched with a silicon resistant etch, with the non-planar silylated surface remaining as a narrow stud. It will be understood by those having skill in the art that other techniques of forming studs from non-planar surfaces may be employed according to the invention.

Figure 5:
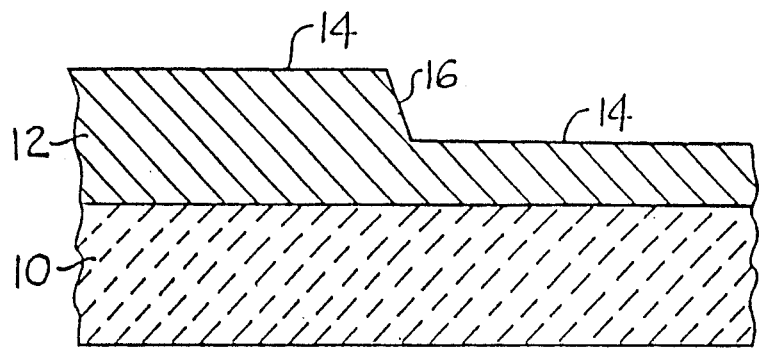
FIG. 5 illustrates a semiconductor substrate having a non-planar coating of resist material deposited thereon, according to a second embodiment of the present invention.

Referring now to FIG. 5, the second embodiment begins with a substrate 10, having a material 12 with a non-planar surface or sidewall 16 thereon as was described in connection with FIG. 1. In this embodiment, layer 12 may be conventional positive resist film such as Shipley positive resist material which is partially exposed by light of a wavelength to which the material is sensitive (e.g. near UV light at a wavelength of about 400 nm), and is developed with a hydroxide base developer (e.g. Shipley MF312), and which has subsequently been hardened (crosslinked) by a high temperature (160° C.-200° C.) bake. For example, if 100 mJ/Cm² of UV radiation is required to fully expose the resist, and the contrast of the resist is 2, then 56 mJ/Cm² will leave half the film in the exposed areas after developing.

Figure 6:
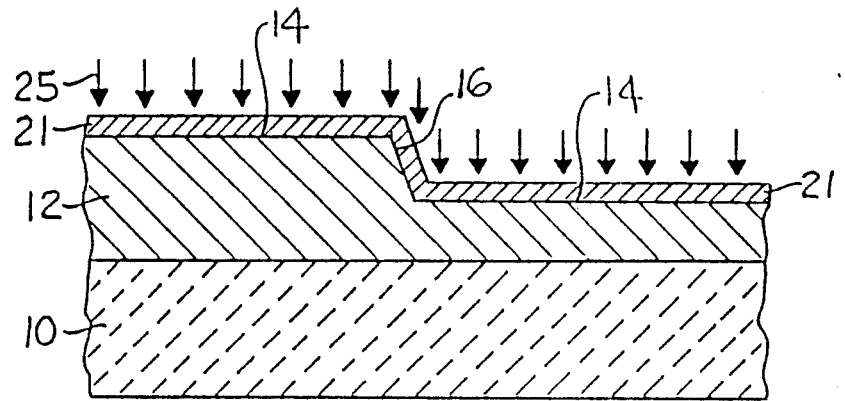
FIG. 6 illustrates exposure of a conformal coating on the non-planar coating FIG. 5, to realize an anisotropically hardened top layer, according to a second embodiment of the present invention.

Referring now to FIG. 6, a layer 21 of a conventional positive resist, such as Shipley positive resist material, is spun on layer 12 to form a thin conformal layer 0.05 to 0.2 μm thick. For the embodiment shown in FIG. 6, layer 21 is uniformly thick on parallel surface portions 14 and on oblique surface portion 16 of resist 12. As is well known to those having skill in the art, uniform coating of resist on parallel and oblique regions may be obtained by spin coating a coating of resist which is much thinner than the height of the topographical features on the substrate. Still referring to FIG. 6, layer 21 is then blanket exposed to a directional flux 25 of radiation between 2000 and 5000 Ångstroms, perpendicular to surfaces 14, which is suitable for exposure of region 21. However, since the oblique portion of region 21 on the sidewall 16 is less exposed than the remaining portions of layer 21.

Figure 7:
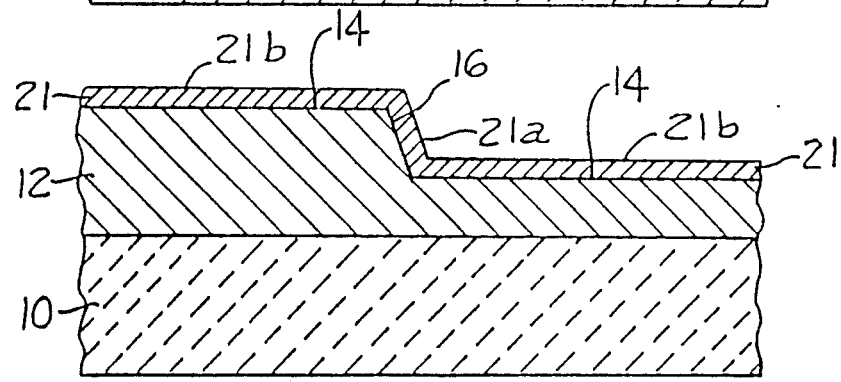
FIG. 7 illustrates the structure of FIG. 6 after incorporation of a material into the anisotropically hardened top layer, according to a second embodiment of the present invention.
Figure 8:
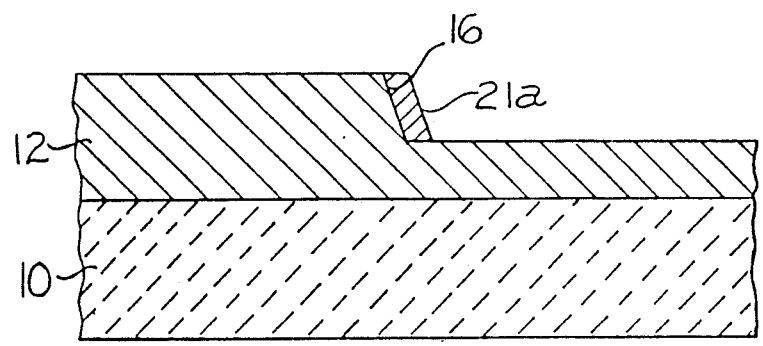
FIG. 8 illustrates the structure of FIG. 7 after removal of portions of the anisotropically hardened top layer, according to a second embodiment of the present invention.

Referring now to FIG. 7, the partially exposed portion of resist layer 21 on sidewall 16 is shown as 21a, and the fully exposed portions of resist layer 21 are shown as 21b. The structure of FIG. 7 is then developed with a conventional hydroxide base developer (e.g. Shipley MF312) to develop fully exposed regions 21b. Partially exposed region 21a remains unchanged. The structure of FIG. 7 is then flood exposed to isotropic ultraviolet or deep ultraviolet radiation to completely expose region 21a. A Desire type silylation process using HMDS (as described above in connection with FIG. 2) then adds silicon into region 21a.

Figure 9:
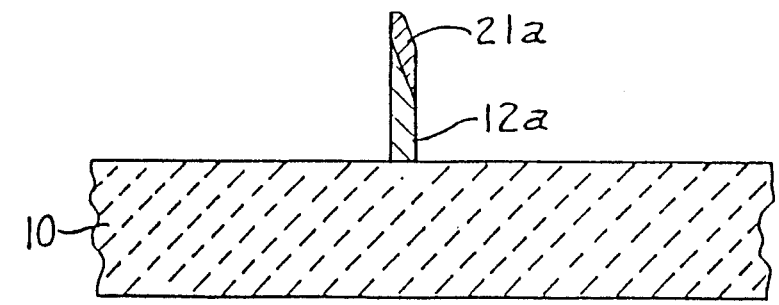
FIG. 9 illustrates the structure of FIG. 8 following an anisotropic etch to form a stud, according to a second embodiment of the present invention.

Referring now to FIG. 9, an oxygen reactive ion etch (described above in connection with FIG. 4) is performed to remove the underlying layer 12. Silylated layer 21a and underlying layer 12a remain because silylated layer 21a is impervious to the oxygen reactive ion etch. A narrow stud comprising regions 21a and 12a is thereby formed. This feature may be useful in itself as a spacer or may be used for subsequent processing of the substrate 10.

There are many modifications and other embodiments of the invention that would readily come to one skilled in the art having the benefit of the teachings presented in this description and the associated drawings. Therefore it is to be understood that the invention is not limited to the specific teachings in this disclosure, and that the modifications and embodiments are intended to be included within the scope of the following claims.

THAT WHICH IS CLAIMED:

1. A method for anisotropically hardening a protective coating to provide a well defined feature for integrated circuit manufacture, the method comprising:
    forming a non-planar coating on selected areas of a substrate, with a photoresist material that is resistant to selected subsequent processing steps after exposure to incident flux, the sensitivity of the coating to the incident flux being a function of the angle between the incident flux and the coating;
    anisotropically hardening the coating by exposing selected portions thereof to a predetermined dosage of directional flux so that first portions of the coating irradiated at a first angle are hardened and second portions of the coating irradiated at a second angle are less hardened; and
    forming features for integrated circuit manufacture corresponding to one of said first and second portions of the coating.

2. The method of claim 1 wherein said first angle corresponds to an angle to which the coating has a relatively high sensitivity and wherein said second angle corresponds to an angle to which the coating has a relatively low sensitivity.

3. The method of claim 1 wherein said first angle corresponds to an angle to which the coating has a relatively low sensitivity and wherein said second angle corresponds to an angle to which the coating has a relatively high sensitivity.

4. The method of claim 1 wherein the forming features step comprises the step of removing the second portions of the coating to form a stud corresponding to the first portions of the coating.

5. The method of claim 1 wherein said step of forming a non-planar coating comprises coating the substrate with a photoresist film having a high sensitivity to flux perpendicularly incident to the surface thereof.

6. The method of claim 1 wherein said step of anisotropically hardening comprises the step of irradiating the coating with radiation that is perpendicularly incident to the first portions thereof.

7. The method of claim 1 wherein said step of anisotropically hardening comprises the step of irradiating the coating with radiation that is perpendicularly incident to the second portions thereof.

8. A method for anisotropically hardening a protective coating to provide a well defined feature for integrated circuit manufacture, the method comprising:
    forming a non-planar coating on selected areas of the substrate, with a photoresist material that is resistant to selected subsequent processing steps after exposure to incident flux, the sensitivity of the coating to the incident flux being a function of the angle between the incident flux and the coating;
    anisotropically hardening the coating by exposing the coating to a predetermined dosage of direction flux so that first portions of the coating irradiated at a first angle are hardened and second portions of the coating irradiated at a second angle are less hardened;
    exposing the coating to a material, to incorporate the material into the second portions of the coating and
    forming features for integrated circuit manufacture corresponding to one of said first and second portions of the coating.

9. The method of claim 8 wherein the step of exposing the coating to a material comprises the step of exposing the coating to silicon to thereby silylate the second portions of the coating.

10. The method of claim 8 wherein said forming features step comprises the step of removing the first portions of the coating by etching the coating with an etchant, to which said material is resistent.

11. The method of claim 9 wherein said forming features step comprises the step of removing the first portions of the coating by etching the coating with a silicon resistant etchant.

12. A method for anisotropically hardening a protective coating to provide a well defined feature for integrated circuit manufacture, the method comprising:
    forming a non-planar coating on selected areas of a substrate, with a photoresist material that is resistant to selected subsequent processing steps after exposure to incident flux, the sensitivity of the coating to the incident flux being a function of the angle between the incident flux and the coating;
    anisotropically hardening the coating by exposing selected portions thereof to a predetermined dosage of directional flux so that first portions of the coating irradiated at a first angle are hardened and second portions of the coating irradiated at a second angle are less hardened; and
    removing the first portions of the coating to form a stud corresponding to the second portions of the coating.

* * * * *

UNITED STATES PATENT AND TRADEMARK OFFICE
CERTIFICATE OF CORRECTION

PATENT NO. : 5,064,748
DATED : November 12, 1991
INVENTOR(S) : Stephen M. Bobbio It is certified that error appears in the above-identified patent and that said Letters Patent is hereby corrected as shown below:

Column 3, line 42, delete "Conventional" and substitute --conventional-- therefore.

At column 4, line 23, please delete "Onto" and substitute --onto-- therefore.

At column 5, line 7, please delete "Well" and substitute --well-- therefore.

At column 6, line 31, please delete "direction" and substitute --directional-- therefore.

Signed and Sealed this

Ninth Day of March, 1993

*Attest:*

STEPHEN G. KUNIN

*Attesting Officer*     *Acting Commissioner of Patents and Trademarks*